United States Patent
Terada et al.

(10) Patent No.: US 7,230,436 B2
(45) Date of Patent: Jun. 12, 2007

(54) LASER BEAM INSPECTION EQUIPMENT

(75) Inventors: Hirotoshi Terada, Hamamatsu (JP);
Hiroyoshi Suzuki, Hamamatsu (JP);
Toshimichi Ishizuka, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/542,650

(22) PCT Filed: Jan. 16, 2004

(86) PCT No.: PCT/JP2004/000335

§ 371 (c)(1),
(2), (4) Date: Jan. 9, 2006

(87) PCT Pub. No.: WO2004/065972

PCT Pub. Date: Aug. 5, 2004

(65) Prior Publication Data
US 2006/0164109 A1    Jul. 27, 2006

(30) Foreign Application Priority Data
Jan. 20, 2003   (JP) .......................... 2003-011276

(51) Int. Cl.
*G01R 31/302* (2006.01)
(52) U.S. Cl. .................................... 324/752
(58) Field of Classification Search ............ None
See application file for complete search history.

(56) References Cited

U.S. PATENT DOCUMENTS 6,028,435 A * 2/2000 Nikawa ................ 324/752
6,407,560 B1 * 6/2002 Walraven et al. ......... 324/752
6,444,895 B1   9/2002 Nikawa

FOREIGN PATENT DOCUMENTS

| JP | 54-128770 A | 10/1979 |
| JP | 11-118887 | 4/1999 |
| JP | 11-316266 | 11/1999 |
| JP | 11-316266 A | 11/1999 |
| JP | 2000-286314 A | 10/2000 |
| JP | 2001-004719 A | 1/2001 |
| JP | 2002-313859 | 10/2002 |

\* cited by examiner

*Primary Examiner*—Ha Tran Nguyen
*Assistant Examiner*—Trung Q. Nguyen
(74) *Attorney, Agent, or Firm*—Drinker Biddle & Reath LLP (57) ABSTRACT

The present invention relates to a laser beam inspection apparatus for inspecting a defect on a sample such as semiconductor integrated circuits by using a laser beam. The laser beam inspection apparatus irradiates a laser beam to a sample supplied with a constant current or applied by a constant voltage, and then detects indirectly a change in current or a change in electric field corresponding to a change in the value of resistance developed by scanning the laser beam along the surface of the sample. For example, the change in current is conducted indirectly in such a manner that a magnetic field detecting apparatus detects the change in the magnetic field caused by a current flowing the power supply line provided between a constant voltage source and a sample, and whereby it becomes possible to specify the defective area of the sample based on the detection of the change in the magnetic field.

12 Claims, 11 Drawing Sheets

LASER BEAM INSPECTION EQUIPMENT

TECHNICAL FIELD

The present invention relates to an apparatus for inspecting a sample such as semiconductor integrated circuits by using a laser beam, and more specifically to a laser beam inspection apparatus specifying a defective area by measuring indirectly a change of the value of resistance of the sample accompanied by a laser beam irradiation.

BACKGROUND ART

Figure 1:
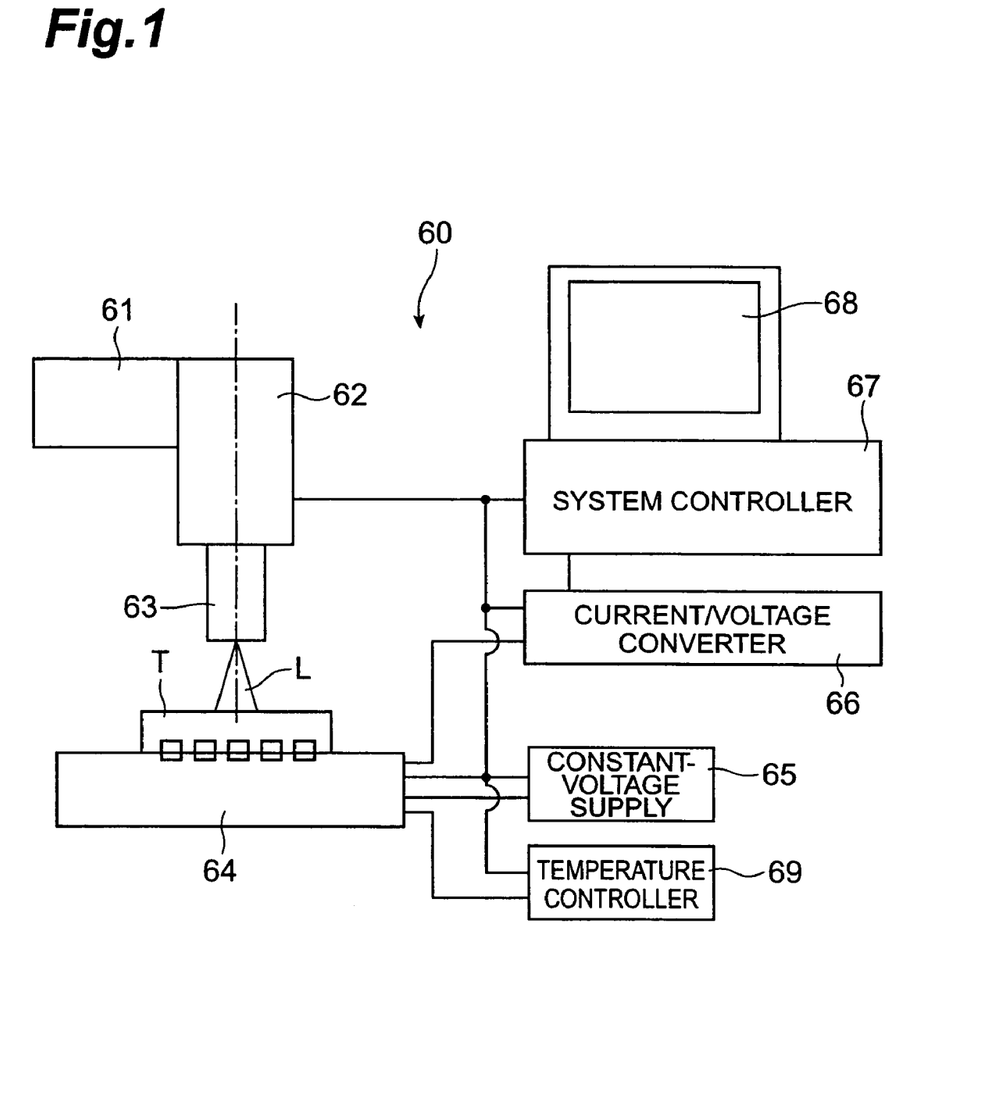
FIG. 1 is a block diagram showing the construction of a conventional OBIRCH measuring apparatus.

A laser beam apparatus such as an OBIRCH (Optical Beam Induced Resistance Change) measuring apparatus as disclosed in JP-A-2001-4719, for example, is known as an apparatus for inspecting an inner defect in a sample such as semiconductor integrated circuits. The OBIRCH measuring equipment irradiates a laser beam to the sample, and measures a change in the value of resistance within the simple caused by the heat generation accompanied by beam heat. FIG. 1 is a block diagram showing a construction of conventional OBIRCH measuring equipment as the laser beam inspection apparatus. As shown in FIG. 1, in the conventional OBIRCH measuring equipment 60, upon the optical 20, path of a laser beam emitted from a laser source 61, a laser scanning unit 62 for raster-scanning the laser beam in a two-dimensional direction perpendicular to its incident direction, and a microscope 63 for condensing the scanned laser beam L at a micro-spot diameter are arranged. A sample T such as semiconductor integrated circuits is disposed on a sample base 64 at a focus point of the microscope 63. A predetermined voltage is applied to the sample T from a constant voltage supply 65. The sample T is connected to a current/voltage converter including an operational amplifier, a feedback resistor, and the like. The current/voltage converter 66 is connected to a system controller 67, and the system controller 67 further is connected to a monitor 68. The system controller 67 is also connected to a laser scanning unit 62. Furthermore, the system controller 67 is connected to a temperature controller 69 for maintaining the temperature of the sample base 64 at a predetermined temperature.

The laser beam L emitted from the laser source 61 is raster-scanned in a two-dimensional direction that is perpendicular on the optical path by means of the laser scanning unit 62, and further condensed by the microscope 63 to be irradiated to a fine area on the surface of the sample T. This laser beam scanning is controlled by the system controller 67. A given voltage is applied in advance to the sample T by the constant voltage supply 65, and a given current is flown in the circuit. At the irradiation spot of the sample T irradiated by the laser beam, the temperature of the spot rises with absorption of the laser beam and thereby the specific resistance thereof changes. Therefore, the amount of current flown in the sample T also changes. The heat conductance is poor at the position having voids and so on. For this reason, when the laser beam is irradiated to such a position, it is hard to escape generated heat at the ambience, resulting in a great temperature rise. Consequently, at the defective spot of the sample applied by the given voltage, the change in the specific resistance is increased with an increase of the temperature, and the change of the value of current is also enlarged.

In the current/voltage converter 66, the detected current is converted to a voltage after it is once amplified, and a detection signal corresponding to the converted voltage value is transferred from the current/voltage converter 66 to the system controller 67. The system controller 67 converts the difference of the voltage values each obtained as a detection signal to brightness information, and displays lined up image information corresponding to laser beam irradiation positions on the monitor 68. In this way, the defective spot of the sample T may be confirmed by an image.

DISCLOSURE OF THE PRESENT INVENTION

After studying the aforementioned prior art, the inventors et al. found out following problems. That is, for this type of OBIRCH measuring equipment, an measurement with respect to a sample flown by a large current of several hundreds mA to several A and a sample applied by a high voltage of several tens V to several kV is requested. In addition, a measurement in a state connected with another tester also is required. However, the OBIRCH measuring equipment 60 disclosed in the above JP-A-2001-4719 detects directly the current flown in the sample, and inspects the defect of the sample T based on the value of current. For this reason, the above conventional OBIRCH measuring equipment cannot help applying a large current or high voltage to the current/voltage converter 66 upon measuring the large-current and high-voltage applied sample, which may cause breakdown of the current/voltage converter 66. Accordingly, when the sample which should be applied by a large current or high voltage is measured, there may be a possibility incapable of dealing with this sample. Also, since a detector serving as a current/voltage converter corresponding to the tester has to be installed in order to install another tester, it is difficult to employ the tester, impossible in effect.

On the other hand, since the OBIRCH measuring equipment disclosed in the above JP-A-2001-4719 detects directly the current, there is also a problem that the sample base could absorb a subtle change in current or change in voltage where the current flows through the sample base, thereby being unable to measure a feeble current and so on.

The present invention is achieved to overcome the aforementioned problems, and it is an object to provide a laser beam inspection apparatus having a construction for specifying a defect of a sample without detecting directly a current flown in the sample or a voltage applied thereto.

A laser beam inspection apparatus according to the present invention specifies a defective area of the sample in such a manner that an electrical change, for example, a change in current or in voltage, corresponding to a change in the value of resistance is detected indirectly by scanning a laser beam to be irradiated to the sample.

Specifically, when the change in current is detected indirectly, a laser beam inspection apparatus according to the present invention includes an power supply having a power supply line, a laser source, a laser scanning unit, a magnetic field detecting apparatus, and a system controller. The power supply line is constituted by a first power supply line flowing a current from the power supply to a sample, and a second power supply line flowing the current from the sample to the power supply. The power supply is a constant voltage source for applying a constant voltage to the sample disposed on the power supply line. The laser source produces a laser beam to be irradiated to a predetermined area on the surface of the sample. The laser scanning unit scans the laser beam along the surface of the sample. The magnetic field detecting apparatus detects the change in the magnetic field caused by the current flown in the power supply line. Then, the system controller specifies the changed area (defective area of the sample) in the value of resistance in the sample, based on both the irradiation position of the laser beam and the irradiation position of the change in the magnetic field in the power supply line detected by the magnetic field detecting apparatus.

As stated above, the laser beam detecting apparatus according to the present invention, without detecting directly the current flown in the sample, determines as 'defective' where there occurs the change in the magnetic field, while detecting the change in the magnetic field developed by the current to be supplied to the sample by the magnetic field detecting apparatus. In such a way, without detecting directly the change in the current, the change in the magnetic field developed by the current is detected by the magnetic field detecting apparatus; thus, the power supply line and the magnetic field detecting apparatus can be provided independently. Therefore, even in the case of measuring a sample to be flown by a large current, it is easily carried out by use of a magnetic field detector corresponding to the large current.

In this case, to the above magnetic field detecting apparatus, for instance, a SQUID (superconducting quantum interference detectors) flux meter, a Hall element magnetic sensor, a flux gate sensor, a pickup-type magnetic sensor, a MO (magnetooptic) element sensor, a MR (magnetoresistance) element sensor, a GMR (giant magnetoresistive) element sensor, a TMR (tunneling magentoresistive) element sensor and so on are applicable. An application of these magnetic field detecting apparatuses to the magnetic field detecting apparatus enables to detect easily the change in the magnetic field corresponding to the change in the current. In particular, the magnetic sensor such as the MR element sensor, GMR element sensor, and TMR element sensor employed as a magnetic pick-up device for a hard disc drive is capable of detecting a local magnetic change; accordingly, even in wirings having a narrow pitch outside a semiconductor device, only the wirings to be detected can be selectively detected.

In addition, the laser beam inspection apparatus according to the present invention may further comprise a mounting structure for mounting the magnetic field detecting apparatus to the power supply line. When such a mounting structure is provided, the magnetic field detecting apparatus can be detached conveniently to the power supply line.

Further, the laser beam inspection apparatus according to the present invention may comprise an amplifier for amplifying a detection amount of change in the magnetic field detected by the magnetic field detecting apparatus. When such an amplifier is provided, even in the case of making an inspection of a sample to be flown by a relatively small current, it becomes possible to detect surely a change in the current. In contrast, in the inspection of the sample to be flown by a large current, it is unnecessary to make use of the amplifier.

The laser beam inspection apparatus according to the present invention may further comprise a noise removing or eliminating device for removing a noise to be contained when detecting the change in the magnetic field. Upon the indirect measurement of the amount of change in the current, when a power supply capable of supplying a large current to the sample is employed, it is independent of a detecting unit; thus, it is considered that a noise involved in the power supply comes to affect greatly to the detection. In this case, when the noise removing device for removing the noise is employed, the noise caused by the power supply and the like can be eliminated. As a result, the S/N ratio is improved, thereby enabling a detection with a high sensitivity.

In addition, it is preferable that a lock-in amplifier is constituted by the amplifier and the noise removing device. The lock-in amplifier has both functions of the amplifier and noise removing device, thereby enabling signal amplification and noise removal with downsizing of the whole apparatus.

On the other hand, when the change in voltage is detected indirectly, a laser beam inspection apparatus according to the present invention includes an power supply having a power supply line, a laser source, a laser scanning unit, an electric field detecting apparatus, and a system controller. The power supply line is constituted by a first power supply line flowing a current from the power supply to a sample, and a second power supply line flowing the current from the sample to the power supply line. The power supply is a constant current source for applying a constant voltage to the sample disposed on the power supply line. The laser source produces a laser beam to be irradiated to a predetermined area on the surface of the sample. The laser scanning unit scans the laser beam along the surface of the sample. The electric field detecting apparatus detects the change in the electric field developed by the voltage applied to the sample. Then, the system controller specifies the change area (defective area of the sample) of the value of resistance in the sample based on the irradiation position of the change in the electric field detected by the electric field detecting apparatus, and the irradiation position of the laser beam.

As described above, the laser beam detecting apparatus according to the present invention, without detecting directly the voltage applied to the sample, determines as 'defective' where there occurs the change in the electric field, while detecting the change in the electric field developed by the voltage to be applied to the sample by the electric field detecting apparatus. In such a way, without detecting directly the voltage applied to the sample, the change in the electric field developed by the voltage is detected by the electric field detecting apparatus; thus, the power supply line and the electric field detecting apparatus can be provided independently. Therefore, even in the case measuring a sample to be applied by a large voltage, it is easily carried out by use of an electric field detector corresponding to the large voltage.

In this case, to the above electric field detecting apparatus, for instance, an EO element and so on are applicable. An application of such a sensor to the electric field detecting apparatus enables to detect easily the change in the electric field corresponding to the change in the voltage.

In addition, the laser beam inspection apparatus according to the present invention may further comprise a mounting structure for mounting the electric field detecting apparatus to the power supply line. When such a mounting structure is provided, the electric field detecting apparatus can be detached conveniently to the power supply line.

Further, the laser beam inspection apparatus according to the present invention may comprise an amplifier for amplifying a detection amount of change in the electric field detected by the electric field detecting apparatus. When such an amplifier is provided, even in the case of making an inspection of a sample to be applied by a relatively small voltage, it becomes possible to detect surely a change in the voltage. In contrast, in the inspection of the sample to be applied by a large voltage, it is unnecessary to make use of the amplifier.

The laser beam inspection apparatus according to the present invention may further comprise a noise removing device for removing a noise to be contained when detecting the change in the electric field. Upon the indirect measurement of the amount of change in the voltage, when a power supply capable of applying a large voltage to the sample is employed, it is independent of a detecting unit; thus, it is considered that a noise involved in the power supply comes to affect greatly to the detection. In this case, when the noise removing device for removing the noise is employed, a noise caused by a power supply and the like can be removed. As a result, the S/N ratio is improved, thereby enabling a detection with a high sensitivity.

In addition, it is preferable that a lock-in amplifier is constituted by the amplifier and the noise removing device. The lock-in amplifier has both functions of the amplifier and noise removing device, thereby enabling signal amplification and noise removal with downsizing of the whole apparatus.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will be apparent to those skilled in the art from this detailed description.

BEST MODES FOR CARRYING OUT THE PRESENT INVENTION

In the following, In the following, embodiments of a laser beam inspection apparatus according to the present invention will be explained in detail with reference to FIGS. 2 to 11. In the explanation of the drawings, the same elements and portions will be denoted by the same reference symbols, and these redundant descriptions will be omitted.

Figure 2:
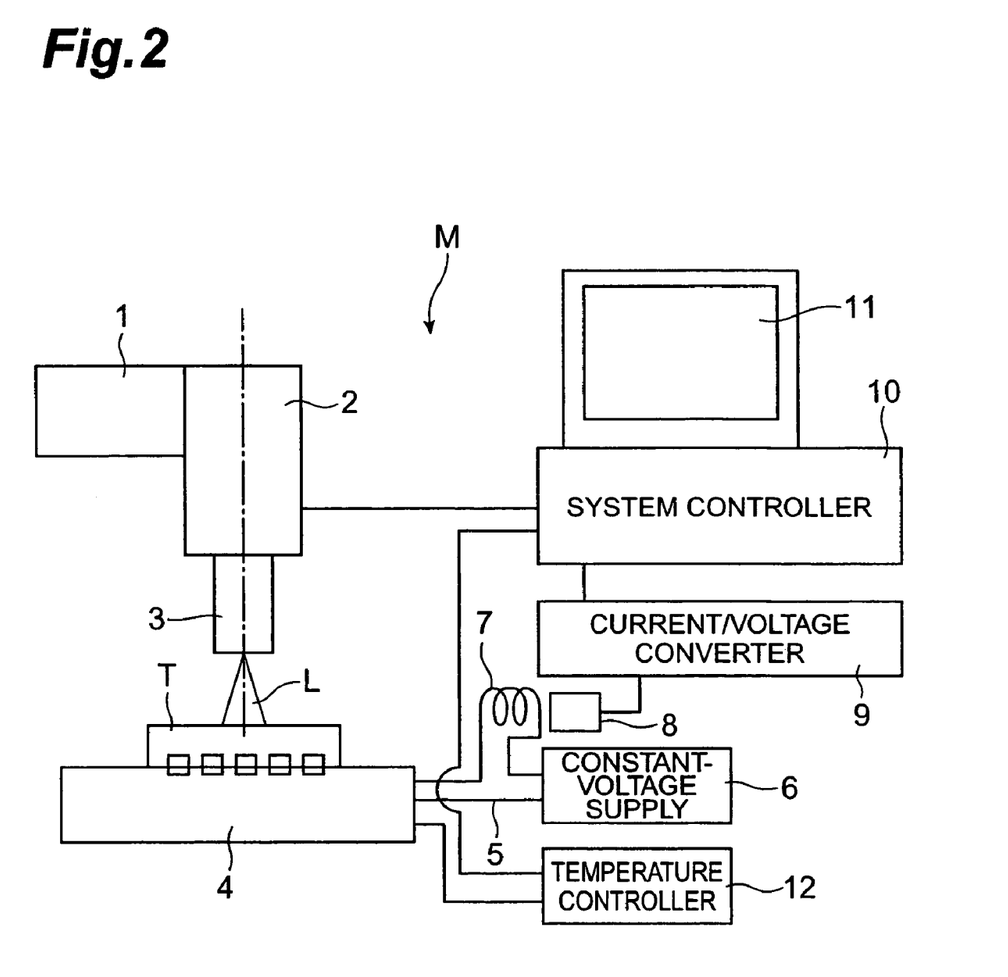
FIG. 2 is a block diagram showing the construction of a first embodiment (OBIRCH measuring equipment) of a laser beam inspection apparatus according to the present invention.

FIG. 2 is a block diagram showing the construction of an OBIRCH measuring equipment as a first embodiment according to the present invention.

As shown in FIG. 2, in the OBIRCH measuring equipment according to the first embodiment, upon the optical path of a laser beam L emitted from a laser source 1 that is a light source, a laser scanning unit 2 for raster-scanning the laser beam L in a two-dimensional direction perpendicular to the optical path, and a microscope 3 for condensing the scanned laser beam L at a micro-spot diameter are arranged.

A sample T such as semiconductor integrated circuits mounted on a sample base 4 is arranged at a focus point of the microscope 3. A constant voltage supply 6 is connected at one end of the sample T through a first power supply line 5 and the sample base 4, and an electric current is supplied to the sample T in the state that a constant voltage is applied to the sample T by the constant voltage supply 6. Further, the other end of the sample T is connected to the constant voltage supply 6 through the sample base 4 and a second power supply line 7. A magnetic field detecting apparatus 8 is installed in the second power supply line 7 or in the vicinity thereof. The magnetic field detecting apparatus 8 detects the change in the magnetic field to be generated by the current flown in the second power supply line 7, and outputs a magnetic field signal as a current signal corresponding to the change in the magnetic field. A variety of devices are applicable to the magnetic field detecting apparatus 8.

The magnetic field detecting apparatus 8 is connected to a current/voltage converter 9 having an amplifying function, outputting a detection current to the current/voltage converter 9. The current/voltage converter 9 once amplifies once the detection current outputted from the magnetic field detecting apparatus 8, and converts the detection current to a voltage value corresponding to the amount of change in the current flown in the second power supply line 7. The current/voltage converter 9 is connected to the system controller 10, and outputs the converted voltage value to the system controller 10 as a detection signal.

The system controller 10 is connected to a monitor 11, and produces brightness information to be displayed on the monitor 11 based on the detection signal outputted from the current/voltage converter 9. Further, the system controller 10 is connected to the laser scanning unit 2, and controls the irradiation position of the laser beam L relative to the sample T. Then, from the brightness information, which is produced based on the difference between the voltage values each of which is sequentially obtained from the current/voltage converter 9 as a detection signal, and the irradiation position of the laser beam L to be detected from the scanning position of the laser scanning unit 2, an image signal to be displayed on the monitor is produced through a predetermined image processing, and then outputted to the monitor 11. The monitor 11 displays the image based on the image signal to be outputted from the system controller 10.

Further, a temperature controller 12 is connected to the sample base 4. The temperature controller 12 is connected to the system controller 10. The system controller 10 controls the temperature controller 12 to adjust the temperature of the sample 4 at a desired temperature corresponding to the sample T.

A description will be given of the operation/action of the laser beam inspection apparatus according to the first embodiment having the construction described above. To be specific, in the OBIRCH measuring equipment M serving as the laser beam inspection apparatus, the sample T is mounted on the sample base 4 to inspect the sample T. The laser beam L condensed at a predetermined spot diameter by the microscope 3 is irradiated to the surface of the sample T. The laser scanning unit 2 raster-scans the condensed laser beam L along the surface of the sample T. At this time, the sample base 4 is controlled at a predetermined temperature by the temperature controller 12. While the raster-scan is carried out by the laser beam L, the current to be supplied in the state where a given voltage is applied to the sample T from the constant voltage supply 6 passes through the first power supply line 5 and second power supply line 7. The current corresponding to the change in the magnetic field caused by the current passing through the second power supply line 7 is produced by the magnetic field detecting apparatus 8 as a detection current. The detection current is supplied to the current/voltage converter 9 and converted to a voltage value corresponding to the amount of change in the current after it is once amplified. The converted voltage value is outputted to the system controller 10 as a detection signal. In the system controller 10, a predetermined image processing (production of brightness information) is carried out based on the difference of the voltage values each obtained sequentially as a detection signal and then outputs the resultant image signal to the monitor 11. The monitor 11 displays an image based on the image signal.

In this case, in the case where an inner defect arises in the sample T, when the laser beam L is irradiated to the defective area, there occurs one change in the value of resistance due to heat generation. Based on the change in the value of resistance, the current value may change in the second power supply line 7. When the current value changes in the second power supply line 7, the magnetic field caused by the current in the second power supply line 7 changes. The magnetic field detection apparatus 8 detects the change in the magnetic field accompanied by the change in the current. The change in the magnetic field is outputted via the current/voltage converter 9 to the system controller 10 as a detection signal (voltage value corresponding to the amount of change in the current). In the system controller 10, brightness information is produced based on the difference of the voltage values each obtained sequentially as a detection signal (image processing). At this time, from the relationship between the laser irradiation position on the sample T and the produced brightness information, the system controller 10 specifies the position causing the inner defect in the sample T, and carries out a monitor display of a defect causing content. Then, an occurrence of the inner defect in the sample T is detected based on the display of the monitor 11.

In the aforementioned inspection of the sample T, the OBIRCH measuring equipment M that is the laser beam inspection apparatus detects the change in the magnetic field caused by the current flown in the second power supply line 7 without measuring directly the currents in the power supply lines 5, 7. For this reason, even in the case of the defect inspection of the sample T applied with a large current from the constant power supply 6, a great load accompanied by the large current is not applied to the magnetic field detecting apparatus 8. Therefore, even in the defect inspection of the sample applied with the large current, this enables the defect inspection in the state where there are little concerns for the breakdown of the detector accompanied by the supply of the large current.

Figure 3:
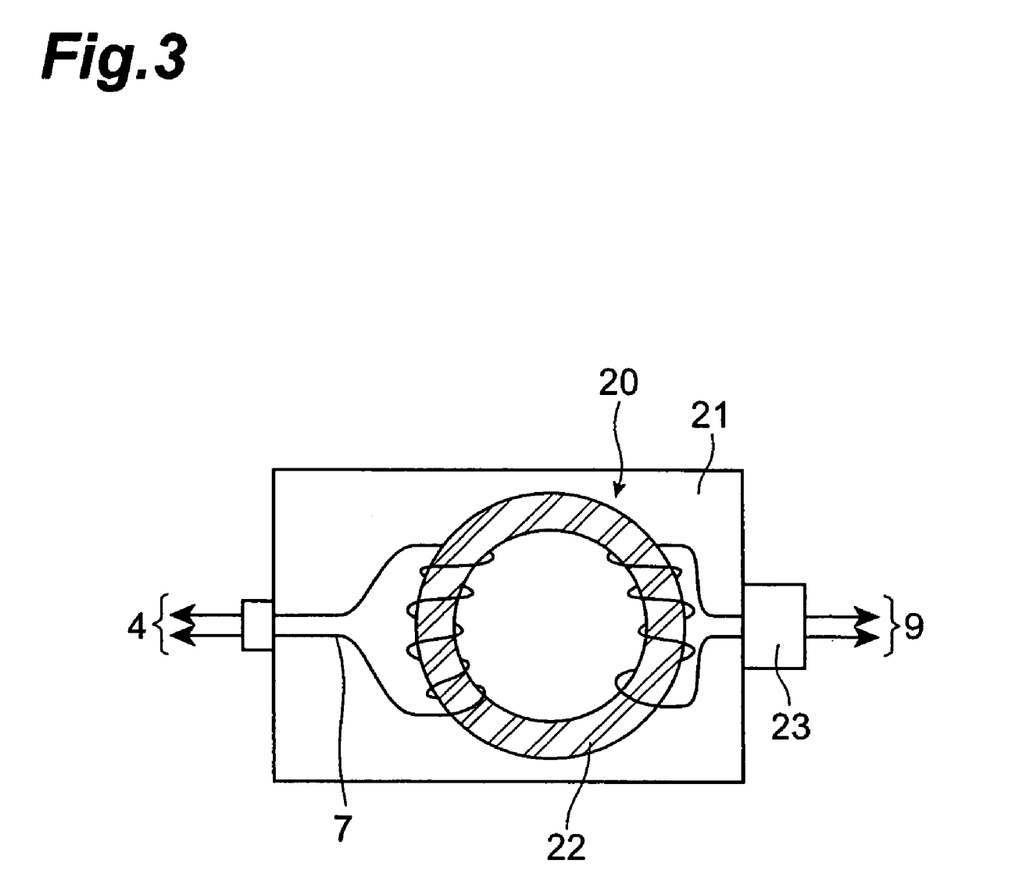
FIG. 3 is a plan view showing the construction of a pickup coil-type magnetometric sensor.

The magnetic field detecting apparatus 8 applicable to the OBIRCH measuring equipment M that is the laser beam inspection apparatus according to the present invention will next be described. As the magnetic field detecting apparatus 8 applicable to the OBIRCH measuring equipment M, a pickup coil-type magnetic sensor 20, for example, is specified as shown in FIG. 3. As shown in FIG. 3, the pickup coil-type magnetic sensor 20 has a base 21, and a ring-shaped ferrite coil 22 provided on the base 21. Part of the ferrite coil 22 is wound with the second power supply line 7, and a connector 23 is installed at the position opposite to the one wound with second power supply line 7. The second power supply line 7 is connected to the sample T through the sample base 4, and the current passing through the sample T flows in the second power supply line 7. In addition, when there occurs a change in the current flown in the second power supply line 7, a change in magnetic flux occurs in the ferrite coil 22, so that the change in the current of the second power supply line 7 can be detected based on the change in the magnetic flux (generation of an induced current). Further, the connector 23 is connected to the current/voltage converter 9, and the induced current generated on the ferrite coil 22 in response to the change in the current flown in the second power supply line 7 is outputted to the current/voltage converter 9 as a detection current.

In such a pickup coil-type magnetic sensor 20, when there occurs a change in the current flown in the second power supply line 7, a change in the magnetic field in the ferrite coil 22 is caused; thus, a current (induction current) corresponding to the amount of the change in the magnetic field is detected through the connector 23 to be outputted to the current/voltage converter 9 as a detection current. In the current/voltage converter 9, based on the induction current corresponding to the amount of the magnetic field outputted from the connector 23, the change in the current flown in the sample T will be detected indirectly. By using the aforementioned pickup coil-type magnetic sensor 20, the detection of the change in the current can be achieved with a high accuracy.

Figure 4:
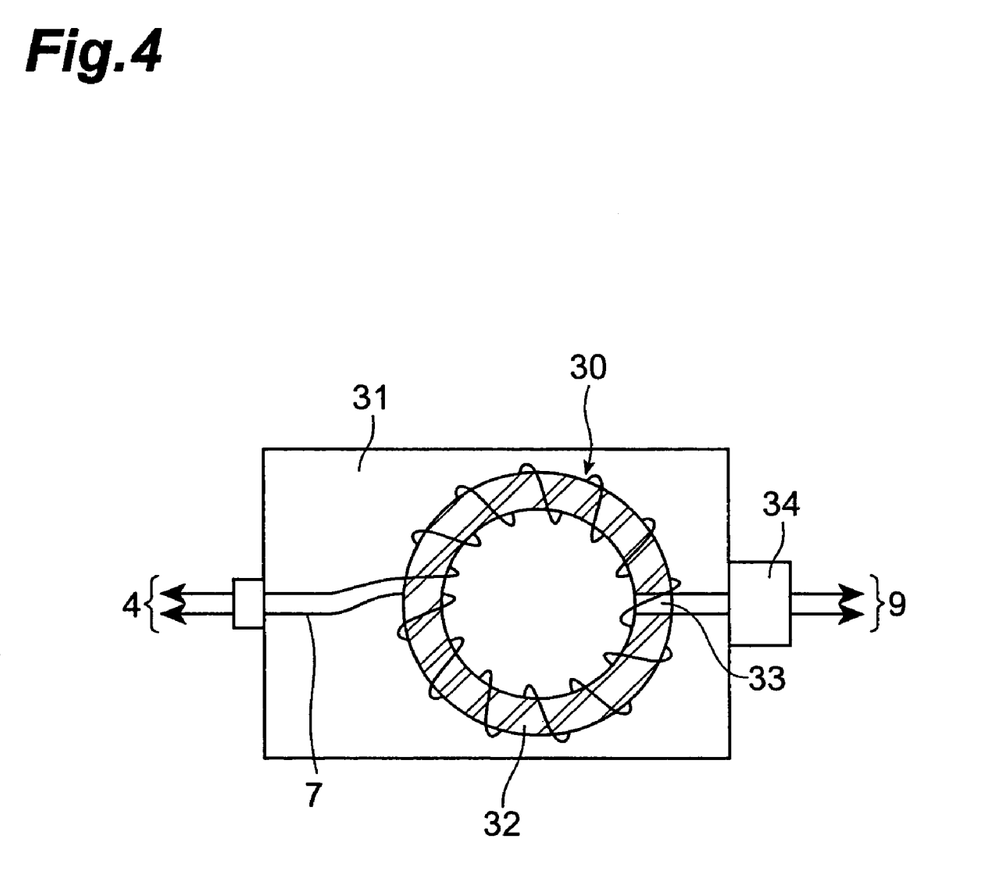
FIG. 4 is a plan view showing the construction of a Hall element-type magnetometric sensor.

Also, the magnetic field detecting apparatus 8 may be a Hall element-type magnetic sensor 30 shown in FIG. 4. As shown in FIG. 4, the Hall element-type magnetic sensor 30 has a base 31 as well as the pickup coil-type magnetic sensor 20 shown in FIG. 3, and a ring-shaped ferrite coil 32 is disposed on the base 31. A second power supply line 7 is generally wound around a ferrite coil 32. Further, a Hall element 33 is installed at part of the ferrite coil 32, while a connector 34 is arranged in the close position of the Hall element 33.

In this way, by using the Hall element-type magnetic sensor 30 provided with the Hall element 33, the detection of the change in the current becomes possible with a high accuracy, and the change in the current can be easily detected under a large current.

Figure 5:
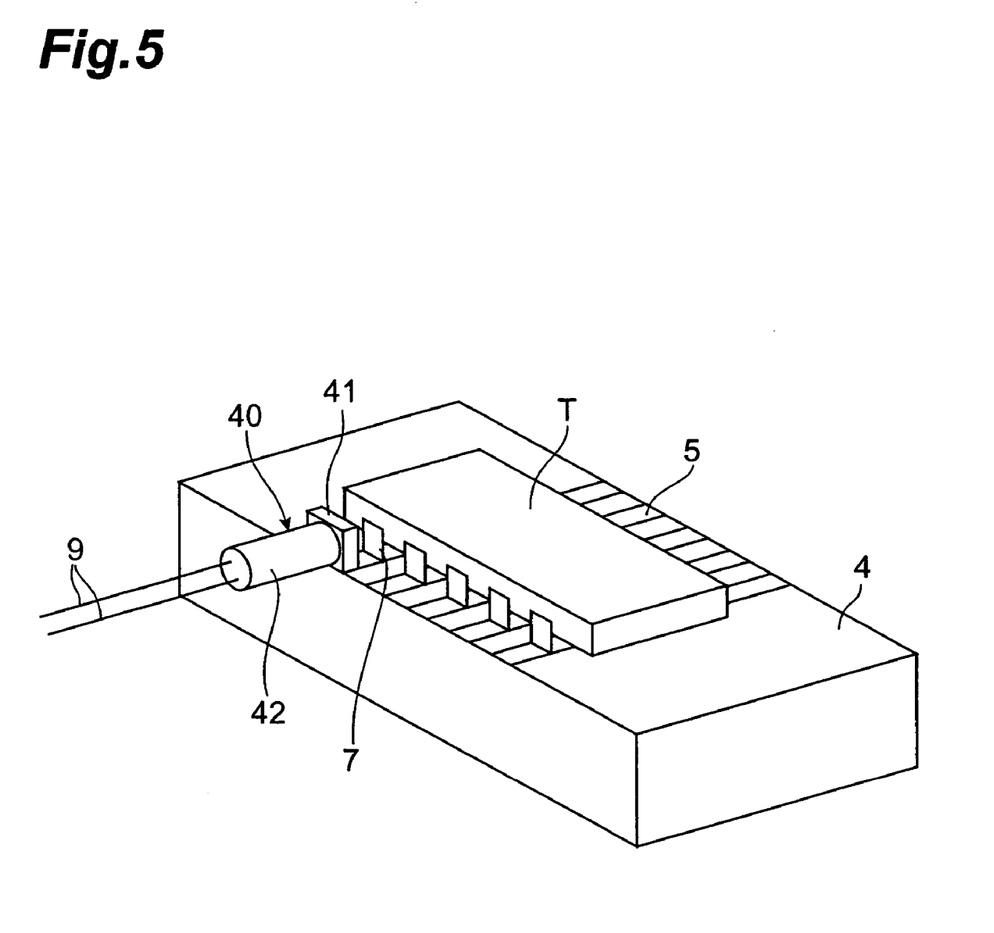
FIG. 5 is a perspective view showing the construction of a tester board mounted with a flux gate sensor.

Further, the magnetic field detecting apparatus 8 may be a flux gate sensor shown in FIG. 5. As shown in FIG. 5, the flux gate sensor 40 includes a mounting unit 41 (included in a mounting structure), and a main body unit 42. The main body unit 42 has a high-magnetic-permeability core and a coil, and is attached in the vicinity of the second power supply line 7 at the sample base 4 by way of the mounting unit 41. The mounting unit 41 is detachably adapted to the sample base 4; when the mounting unit 41 is detached, the main body unit 42 is detachable to the sample base 4.

By using such a flux gate sensor 40, the detection of the magnetic field becomes possible with a further high accuracy. In addition, since the mounting unit 41 is detachably adapted to the sample base 4, an independent magnetic sensor with an appropriate size can be employed for the magnitude of the current flown in the sample T, and so on.

Furthermore, as the magnetic field detecting apparatus 8 in the laser beam inspection apparatus according to the present invention, a high-temperature superconducting thin film sensor, i.e. superconducting quantum interference detectors (hereinafter, referred to as SQUID sensor), may be employed. When the SQUID sensor (SQUID flux meter) is employed, the detection of the change in the current becomes possible with a further high precision. In addition to this, an MR (magnetoresistance) element sensor, an MO (magnetooptic) element sensor for detecting optically the change in current by using a magnetic Kerr effect of a solid, a GMR (giant magnetoresistive) element sensor, a TMR (tunneling magnetoresistive) element sensor, and so on are also applicable to the magnetic field detecting apparatus 8.

Figure 6:
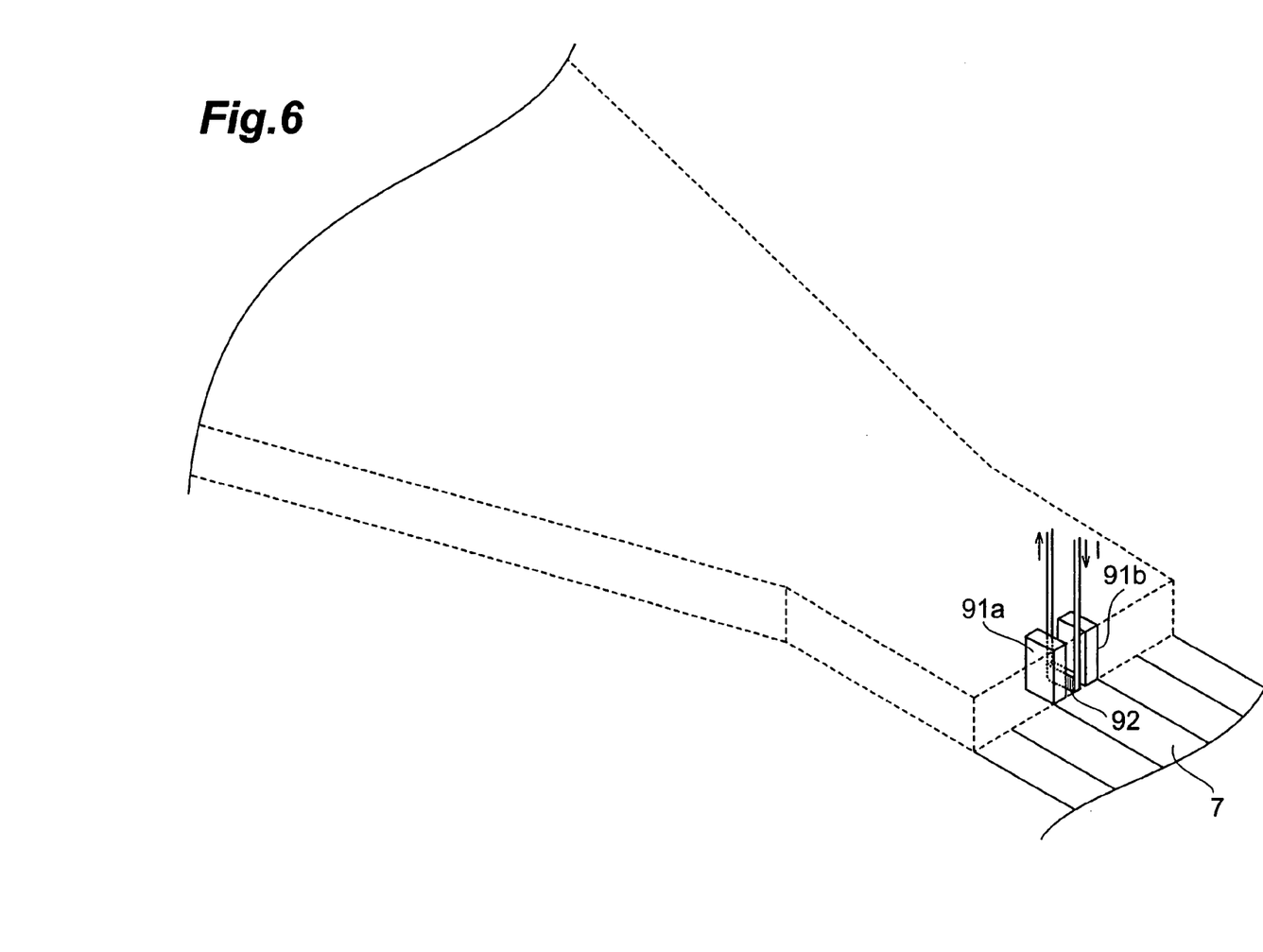
FIG. 6 is a perspective view showing the construction of a GMR sensor.

In particular, the above MR element sensor, GMR element sensor, TMR element senor and so on are the magnetic sensors that are employed for a magnetic pickup device for a hard disk drive, and enables the detection of a local magnetic change; thus, even in wirings with a narrow pitch external to semiconductor devices, only the wirings to be detected can be selectively measured. For instance, FIG. 6 is a view showing the construction of the GMR element sensor widely used for a hard disk drive and so on. As shown in FIG. 6, the GMR element sensor has a GMR head 92 disposed in close proximity to the power supply line 7, and shield plates 91a, 91b disposed to sandwich the GMR head 92 therebetween. The GMR head 92 has a property such that the electrical resistance may change under the influence of a magnetic field. Accordingly, when a detection current I is supplied to the GMR head 92 applied by a constant amount of voltage, the electrical resistance of the GMR head 92 changes corresponding to the change in the magnetic field in close proximity of the power supply line 7; as a result, the change of the magnetic field in close proximity of the power supply line 7 can be detected as a change of the detection current I.

Figure 7:
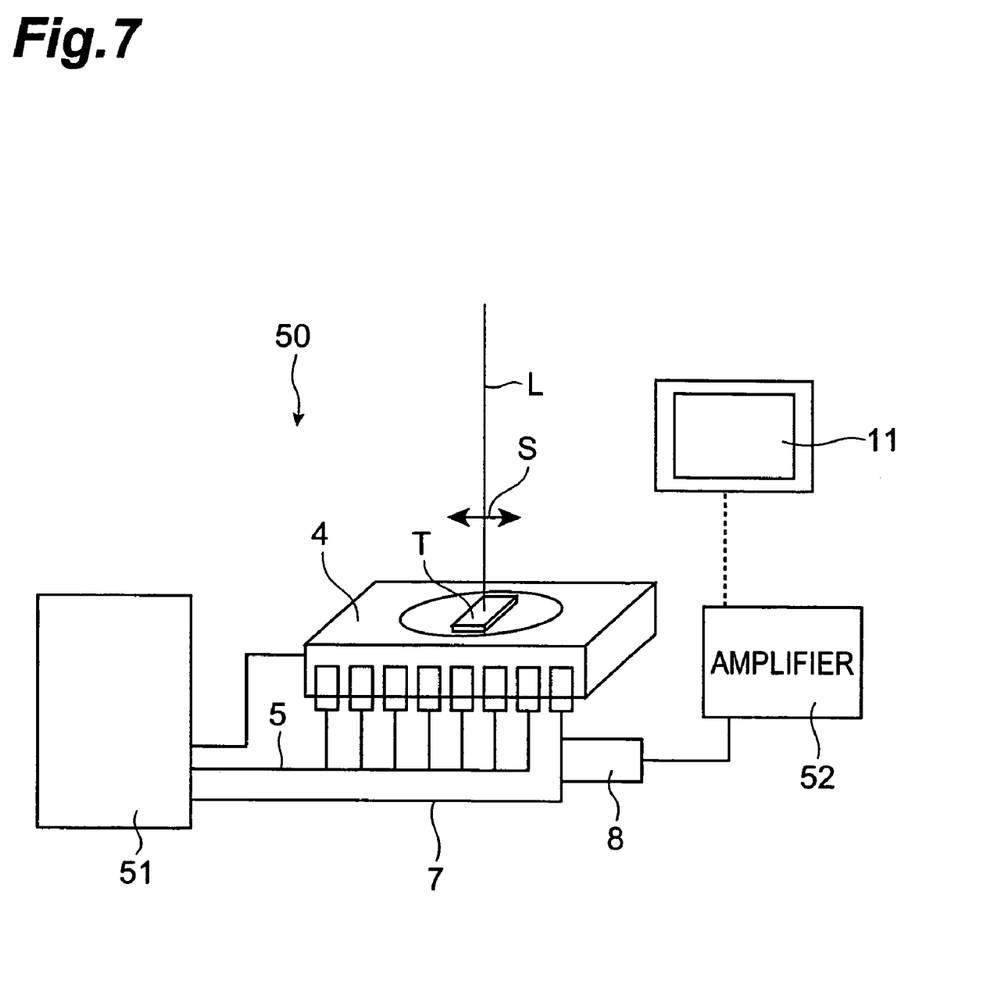
FIG. 7 is a block diagram showing the construction of a second embodiment (OBIRCH measuring equipment) of a laser beam inspection apparatus according to the present invention.

The laser beam inspection apparatus will next be described. FIG. 7 is a block diagram showing the schematic construction of an OBIRCH measuring equipment 50 that is a second embodiment of the laser beam inspection apparatus according to the present invention. The OBIRCH measuring equipment 50 according to the second embodiment differs from the first embodiment in that a LSI tester 51 is applied in place of the constant voltage supply 6 in the aforementioned first embodiment. However, the second embodiment also has a laser source and a laser scanning unit, similarly to the first embodiment (FIG. 2), though these are left out in FIG. 7. In the OBIRCH measuring equipment 50 according to the second embodiment, the sample T such as semiconductor integrated circuits is mounted on the sample base 4; the LSI tester 51 is connected to the sample T by way of the first power supply line 5, second power supply line 7 and sample base 4; the LSI tester 51 applies a constant voltage to the sample T to test this. The sample T is irradiated with a laser to be produced from the laser source and scanned in a direction of arrow S.

The magnetic field detecting apparatus 8 is provided at the close position of the sample T in the second power supply line 7. As the magnetic field detecting apparatus 8, similarly to the above first embodiment, any one of various sensors as shown in FIGS. 3 to 5 is applied. The magnetic field detecting apparatus 8 is connected to the amplifier 52. A current corresponding to the intensity of the magnetic field detected by the magnetic field detecting apparatus 8 is outputted to the amplifier 52, which amplifies the current. Further, the amplifier 52 is connected to the monitor 11, and an image signal produced based on the voltage value converted from the amplified current is displayed on the monitor 11. The change in the magnetic field developed by the change in the current flown in the second power supply line 7 can be detected based on the information displayed on the monitor 11.

In the OBIRCH measuring equipment 50 according to the second embodiment, a laser beam is irradiated on the sample T through the same procedure as that of the above first embodiment. In addition, the laser beam irradiated to the sample T is scanned in the state where a constant voltage is applied from the LSI tester 51. On this laser scanning, the change in the magnetic field developed by the current flown in the second power supply line 7 is detected by the magnetic field detecting apparatus 8. In the amplifier 52, the current corresponding to the amount of change in the magnetic field detected by the magnetic field detecting apparatus 8 is amplified, and an image signal (variation component) is produced based on the voltage value converted from the amplified current. Then, when the variation component is displayed on the monitor 11, the change in the current is detected indirectly. As a result, a defective area in the sample T can be specified based on the change in the current.

Figure 8:
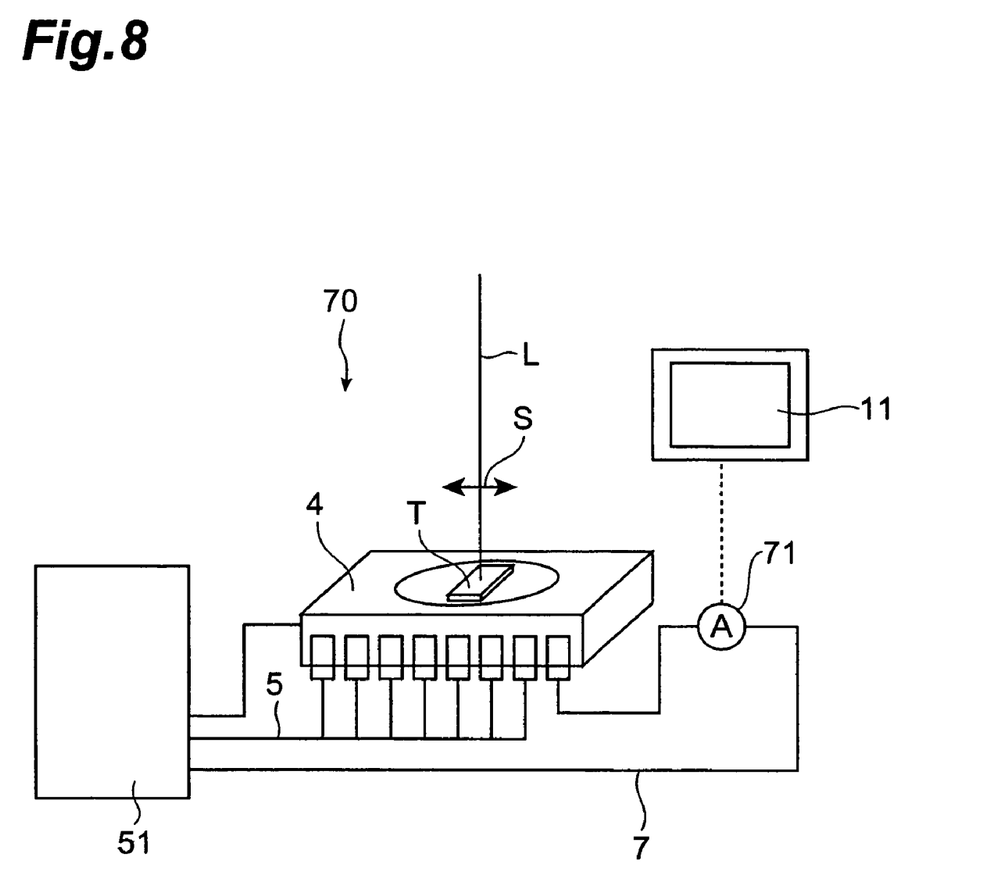
FIG. 8 is a block diagram showing a partial construction of the OBIRCH measuring equipment in comparison with the OBIRCH measuring apparatus according to the second embodiment.

A conventional OBIRCH measuring equipment applied with an LSI tester will now be shown in FIG. 8. As shown in FIG. 8, in the conventional OBIRCH measuring equipment 70, a second power supply line 7 is connected in series to a current measuring equipment 71 by long routing; the change in the current measured at the current measuring equipment 71 is displayed on a monitor 11. The defects of the sample T based on the amount of change in this current are detected; however, since the need for elongating the second power supply line 7 arises, the amount of change in the current can be attenuated by such an elongation. Accordingly, there is a possibility of missing a feeble change in the current.

In contrast, in the OBIRCH measuring equipment 50 according to the second embodiment, the magnetic detecting apparatus 8 is provided close to the sample base 4, that is, close to the sample T. For this reason, before there arises attenuation of the amount of change in the current due to its own passage through the second power supply line 7, the change in the magnetic field can be detected. Accordingly, the defects of the sample T can be detected with a high accuracy. Also, even in the event of a feeble change in the current, when the amount of change in the magnetic field to be detected by an amplifying unit 9 is amplified, the change in the current can be surely detected.

Figure 9:
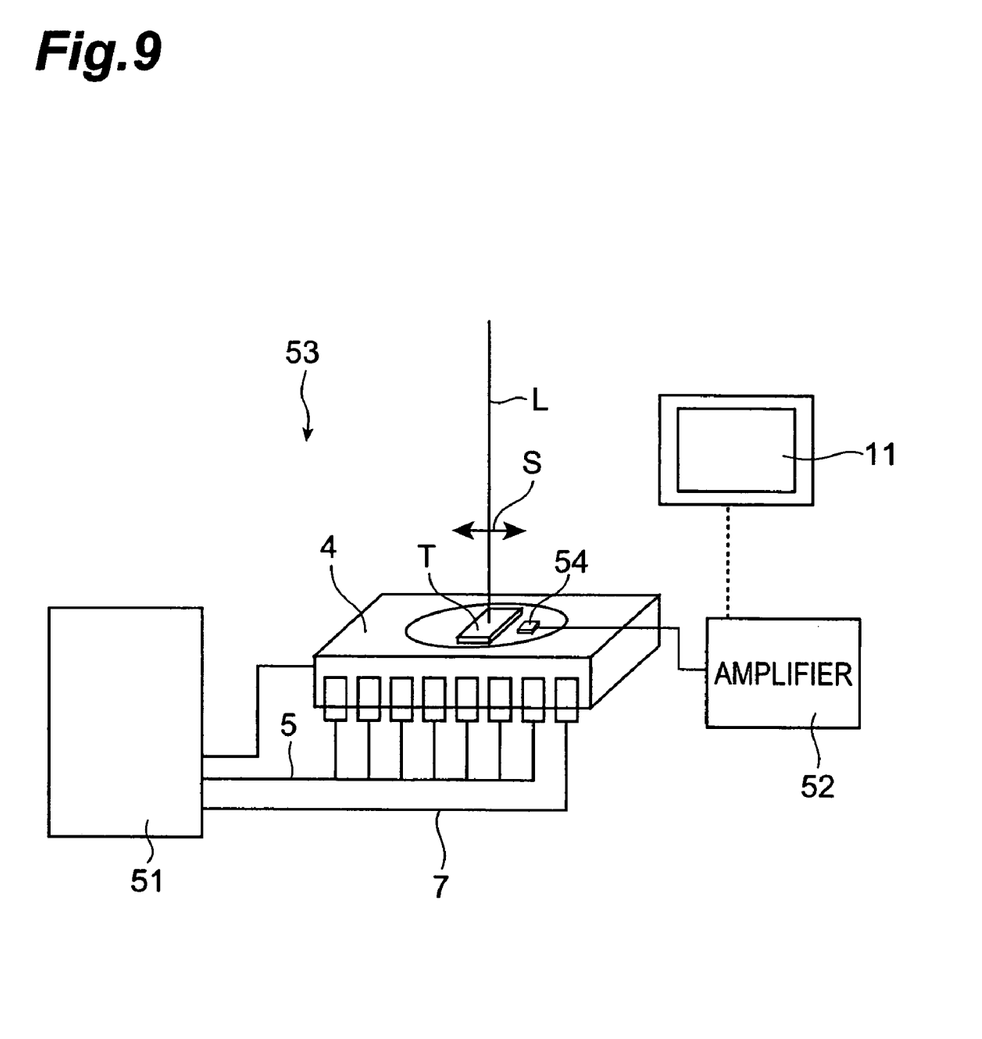
FIG. 9 is a block diagram showing the construction of a modification of the OBIRCH measuring equipment according to the second embodiment.

In addition, FIG. 9 is a view showing the construction of an OBIRCH measuring equipment as a modification of the second embodiment. In the OBIRCH measuring equipment 53 according to the modification, a magnetic field detecting equipment 54 is installed at a power supply line disposed between a sample base 4 and a sample T; the other features are similar to the OBIRCH measuring equipment 50 according to the second embodiment shown in FIG. 7. Also, the modification includes a laser source and a laser scanning unit in the first embodiment (FIG. 2). Thus, when the magnetic field detecting equipment 54 is provided in the power supply line located between the sample base 4 and the sample T, and the detection of the change in the magnetic field is carried out from the power supply line, even such a feeble signal as may be absorbed by the sample base 4 can be detected. Therefore, the detection of the change in the magnetic field can be detected with a higher accuracy by such a feeble detection.

Figure 10:
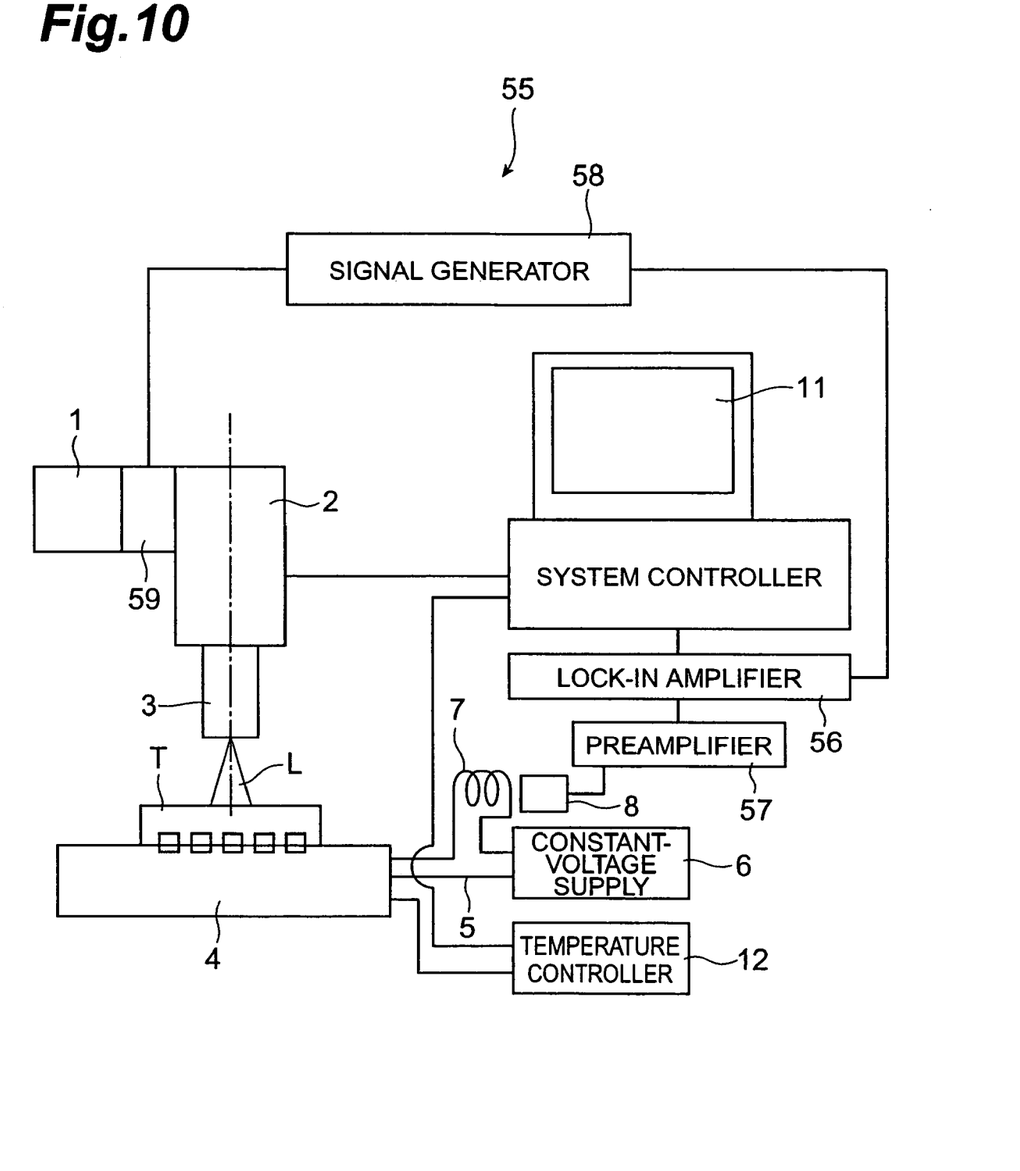
FIG. 10 is a block diagram showing the construction of a third embodiment (OBIRCH measuring equipment) of a laser beam inspection apparatus according to the present invention.

Further, as shown in FIG. 10, it is also possible that the laser beam inspection apparatus according to the present invention utilizes a lock-in amplifier as an amplifier. FIG. 10 is a block diagram showing the construction of an OBIRCH measuring equipment 55 as a third embodiment of the laser beam inspection apparatus according to the present invention. In comparison with the OBIRCH measuring equipment M according to the first embodiment shown in FIG. 2, the OBIRCH measuring equipment 55 shown in FIG. 10 differs from the OBIRCH measuring equipment M in that a lock-in amplifier 56 as an amplifier is provided in place of the current/voltage converter 9. A preamplifier 57 is provided between the lock-in amplifier 56 and the magnetic field detecting apparatus 8, and the lock-in amplifier 56 is connected to a signal generator 58. Further, an optical modulator 59 is disposed between a laser source 1 and a laser scanning unit 2, and the optical modulator 59 is connected to a signal generator 58. For example, an AO modulator, a chopper and so on are applicable to the optical modulator 59.

In the OBIRCH measuring equipment 55 having the aforementioned construction, a modulation signal generated from the signal generator 5 is outputted to the optical modulator 59 and lock-in amplifier 56. The optical modulator 59 receiving the modulation signal modulates in intensity a laser beam from a laser source 1, and the modulation signal outputted toward the lock-in amplifier 56 is used as a synchronization signal of the lock-in amplifier 56. A change in the current induced by a sample T is detected as a current value at the magnetic field detecting apparatus 8, and the detection current is outputted to the lock-in amplifier 56 via the preamplifier 57. After a component synchronizing with the modulation signal outputted from the signal generator 58 is drawn in the lock-in amplifier 56, a voltage value corresponding to a detection value of current amplified as a detection signal is outputted to a system controller 10. Then, when the system controller 10 converts the received detection signal into brightness information in synchronization with scanning of the laser beam originated from the laser scanning unit 2, an image signal is produced, and then an image based on the produced image signal is displayed on the monitor 11.

In this way, when the lock-in amplifier is applied to the amplifier, removal of noise containing in an electrical signal can be performed as well as signal amplification. Accordingly, an improvement of the S/N ratio can be achieved, thereby performing a detection with a high sensitivity.

Though the preferred embodiments of the present invention are described above, the present invention is not limited to the aforementioned ones. For example, in the above embodiment, in the state where a constant voltage is applied to the sample T, the change in the magnetic field is detected from the change in the current; however, for example, the current supplied in the sample T is set to a constant current, it may be also possible to detect the change in an electric field based on the change in the voltage. It is noted that an EO element and the like is applicable to an electric field detecting apparatus for detecting the electric field.

Figure 11:
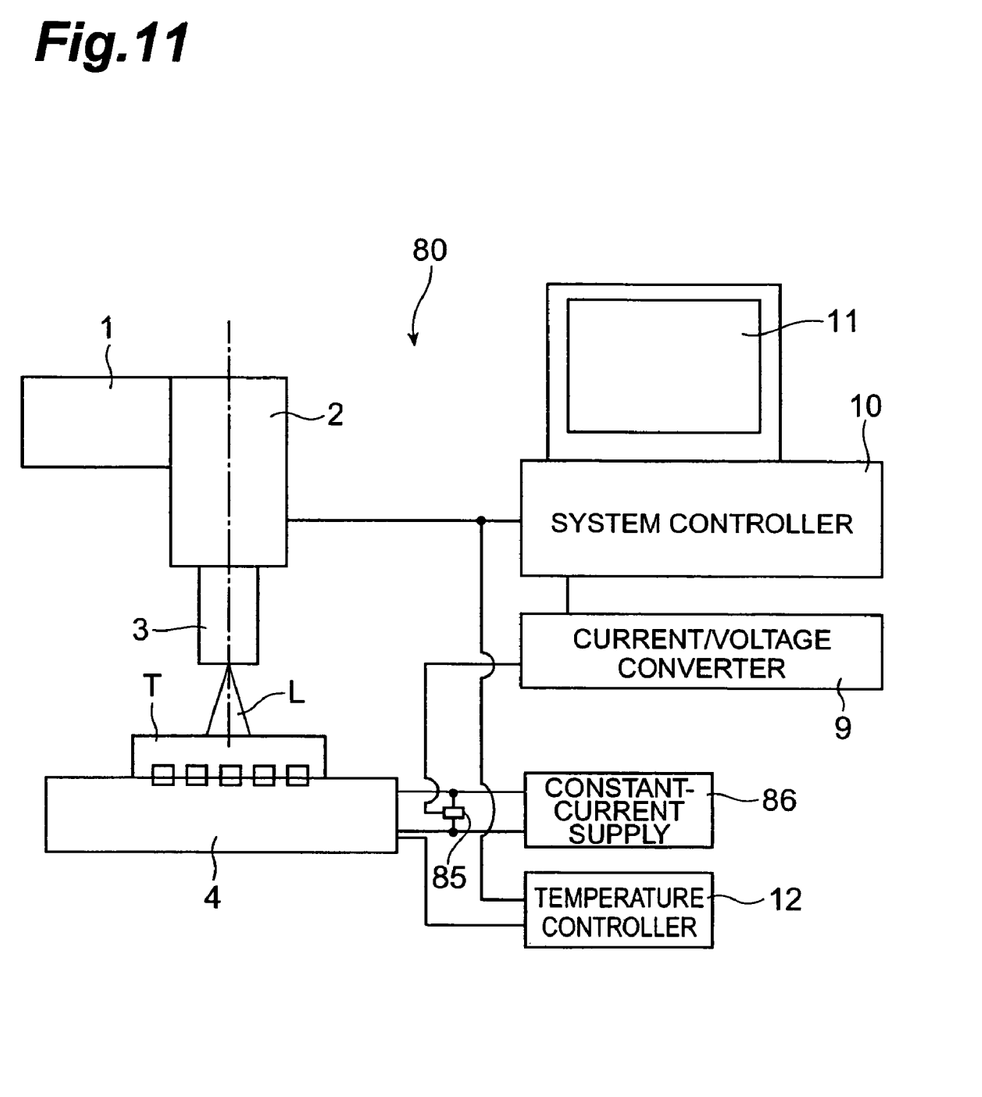
FIG. 11 is a block diagram showing the construction of a fourth embodiment (OBIRCH measuring equipment) of a laser beam inspection apparatus according to the present invention.

In particular, FIG. 11 is a block diagram showing the construction of an OBIRCH measuring equipment 80 having a constant current source 86 and an electric field detecting apparatus 85 as a fourth embodiment of the laser beam inspection apparatus according to the present invention. The OBIRCH measuring equipment 80 according to the fourth embodiment shown in FIG. 11 has a similar construction to that of the first embodiment (FIG. 2) except for having a constant current source 86 in place of the constant voltage source 6 in the above first embodiment, and having an electric field detecting apparatus 85, for example, an EO element and the like, detecting a change in voltage caused by a defect (changing area of values of resistance) in the sample T.

In this case, in the case where there an inner defect arises in the sample T, when a laser beam L is irradiated to the defective area, a change in the value of resistance therein is caused by heat generation. Based on the change in the value of resistance, a voltage applied to the sample changes (a voltage difference between power supply lines connected to the sample changes). The electric field may change due to the change of the voltage difference. The electric field detecting apparatus 85 detects the change in the electric field accompanied by the change in the value of current. The change in the electric field is outputted as a detection signal (voltage value) to a system controller 10 via a current/voltage converter 9. In the system controller 10, brightness information is produced based on the difference between the voltage values each obtained sequentially as a detection signal (image processing). At this time, the system controller 10 specifies an area causing an inner defect in the sample T from the relationship between the laser irradiation position on the sample T and produced brightness information, and makes a monitor display of an occurrence of the defect. Then, based on the display of the monitor 11, the occurrence of the inner defect in the sample T may be detected.

In such an inspection of the sample T, the OBIRCH measuring equipment 80 that is the laser beam inspection apparatus detects the change in the electric field caused by the change in potential difference between the power supply lines 5, 7 without measuring directly the voltage to be applied to the sample T. For this reason, even in the instance applied by a high voltage from the constant current source 86, a heavy load accompanied by the high voltage is not applied to the electric field detecting apparatus 8. Therefore, even in the defect inspection of the sample applied with the large voltage, the defect inspection becomes possible in the state where there are little concerns for the breakdown of the detector accompanied by the application of the high voltage.

From the present invention thus described, it will be obvious that the embodiments of the present invention may be varied in many ways. Such variations are not to be regarded as a departure from the spirit and scope of the present invention, and all such modifications as would be obvious to one skilled in the art are intended for inclusion within the scope of the following claims.

INDUSTRIAL APPLICABILITY

As stated above, in accordance with the present invention, there is provided a laser beam inspection apparatus capable of performing a defect inspection for a sample and the like supplied with a large current or applied by a high voltage may be provided by inspecting defects of a sample without detecting directly a current passing through the sample or a voltage applied to the sample.

The invention claimed is:

1. A laser beam inspection apparatus, comprising:
a constant voltage source, having a power supply line to flow therein a predetermined amount of current, for applying a constant amount of voltage with respect to a sample disposed on said power supply line;
a laser source for producing a laser beam to be irradiated to a predetermined area on a surface of the sample;
a laser scanning unit for scanning the laser beam along the surface of the sample;
a magnetic field detecting apparatus for detecting a change in a magnetic field developed by a current passing through said power supply line; and
a system controller for specifying a changed area in a value of resistance on the sample, based on both an irradiation position of the laser beam and the change in the magnetic field in said power supply line detected by said magnetic field detecting apparatus.

2. A laser beam inspection apparatus according to claim 1, wherein said magnetic field detecting apparatus includes one of a SQUID flux meter, a Hall element magnetic sensor, a flux gate sensor, a pickup coil-type magnetic sensor, a MO element sensor, a MR element sensor, a GMR element sensor and a TMR element sensor.

3. A laser beam inspection apparatus according to claim 1, further comprising a mounting structure for mounting said magnetic field detecting apparatus to a predetermined area of said power supply line.

4. A laser beam inspection apparatus according to claim 1, further comprising an amplifier for amplifying a magnetic field detection signal from said magnetic field detecting apparatus.

5. A laser beam inspection apparatus according to claim 1, further comprising a noise removing device for removing a noise contained in a magnetic field detection signal from said magnetic field detecting apparatus.

6. A laser beam inspection apparatus according to claim 1, further comprising:
an amplifier for amplifying a magnetic field detection signal from said magnetic field detecting apparatus; and
a lock-in amplifier including a noise removing device which removes a noise contained in a magnetic field detection signal from said magnetic field detecting apparatus.

7. A laser beam inspection apparatus, comprising:
a constant current supply, having a power supply line for passing through a constant amount of current, for applying a predetermined amount of voltage to a sample disposed on said power supply line;
a laser source for producing a laser beam to be irradiated to a predetermined area on a surface of the sample;
a laser scanning unit for scanning the laser beam along the surface of the sample;
an electric field detecting apparatus for detecting a change in an electric field caused by a voltage applied to the sample; and
a system controller for specifying a changed area in the value of resistance on the sample, based on both an irradiation position of the laser beam and the change in the electric field detected by said electric field detecting apparatus.

8. A laser beam inspection apparatus according to claim 7, wherein said electric field detecting apparatus includes an EO element.

9. A laser beam inspection apparatus according to claim 7, further comprising a mounting structure for mounting said electric field detecting apparatus to a predetermined area of said power supply line.

10. A laser beam inspection apparatus according to claim 7, further comprising an amplifier for amplifying an electric field detection signal from said electric field detecting apparatus.

11. A laser beam inspection apparatus according to claim 7, further comprising a noise removing device for removing a noise contained in an electric field detection signal from said electric field detecting apparatus.

12. A laser beam inspection apparatus according to claim 7, further comprising:
an amplifier for amplifying an electric field detection signal from said electric field detecting apparatus; and
a lock-in amplifier including a noise removing device which removes a noise contained in an electric field detection signal from said electric field detecting apparatus.

* * * * *